U S005798936A

United States Patent [19]
Cheng

[11] Patent Number: 5,798,936
[45] Date of Patent: Aug. 25, 1998

[54] CONGESTION-DRIVEN PLACEMENT METHOD AND COMPUTER-IMPLEMENTED INTEGRATED-CIRCUIT DESIGN TOOL

[75] Inventor: Chih-liang ("Eric") Cheng, Milpitas, Calif.

[73] Assignee: Avant! Corporation, Fremont, Calif.

[21] Appl. No.: 666,119

[22] Filed: Jun. 21, 1996

[51] Int. Cl.$^6$ ............................. G06F 17/50; G06F 17/10
[52] U.S. Cl. ...................... 364/489; 364/490; 364/491
[58] Field of Search ................................. 364/488–491, 364/578

[56] References Cited

U.S. PATENT DOCUMENTS

| | | | |
|---|---|---|---|
| 5,267,176 | 11/1993 | Antreich et al. | 364/491 |
| 5,506,788 | 4/1996 | Cheng et al. | 364/491 |
| 5,587,923 | 12/1996 | Wang | 364/490 |
| 5,657,242 | 8/1997 | Sekiyama et al. | 364/491 |
| 5,699,265 | 12/1997 | Scepanovic et al. | 364/491 |

OTHER PUBLICATIONS

Natesan et al. ("Clock-skew constrained cell placement", IEEE Comput. Soc. Press, Proceedings of 9th International Conference on VLSI Design, 3 Jan. 1996, pp. 146–149).

Kleinhans et al. ("Gordian: VLSI placement by quadratic programming and slicing optimization", IEEE Transaction on Computer-Aided Design of Integrated Circuits and Systems, vol. 10, Issue 3, Mar. 1991, pp. 356–365).

Mayrhofer et al. ("Congestion-driven placement using a new multi-partitioning heuristic", IEEE Comput. Soc. Press, IEEE International Conference on Computer-Aided Design, 11 Nov. 1990, pp. 332–335).

Takahashi et al. ("Min–cut placement with global objective functions for large scale sea–of–gates arrays", IEEE Transaction on Computer-Aided Design of Integrated Circuits and Systems, vol. 14, issue 4, Apr. 1995, pp. 434–446).

Yan ("Two–way balance–tolerant partitioning based on fuzzy graph clustering for hierarchical design og VLSI systems", IEEE, Conference Proceedings of the 1995 IEEE Fourteenth Annual International Phoenix Conference on Computers and Communications, 28 Mar.

Yan ("Area–ratio–constrained min–cut partitioning for row–based placement", IEEE, Proceedings of the 37th Midwest Symposium on Circuits and Systems, 3 Aug. 1994, pp. 403–406).

Primary Examiner—Emanuel Todd Voeltz
Assistant Examiner—Phallaka Kik
Attorney, Agent, or Firm—Thomas E. Schatzel; Law Offices of Thomas E. Schatzel A Prof. Corporation

[57] ABSTRACT

Hierarchical look-ahead congestion-driven placement is a look-ahead method for avoiding interconnect congestion. It balances the available routing resources. When incorporated into conventional quadratic programming approaches, only minor increases in run-time are needed to produce dramatic decreases in congestion. The macrocell densities are traded between adjacent regions to anticipate congestion, and are estimated based on the current iteration for the distribution of cells and net connections involved. The congestion estimation also takes routing detour due to the presence of large hard macros into account for accuracy. The macrocell density adjustments are propagated to all the neighboring regions at each hierarchical level to revise the prior congestion estimate from the previous hierarchical iteration.

12 Claims, 2 Drawing Sheets

CONGESTION-DRIVEN PLACEMENT METHOD AND COMPUTER-IMPLEMENTED INTEGRATED-CIRCUIT DESIGN TOOL

BACKGROUND OF THE INVENTION

1. Field of the Invention

The present invention relates generally to automatic integrated-circuit placement and routing tools, and more particularly to hierarchical look-ahead congestion-driven placement methods and computer-implement tools for reducing localized routing congestion that can occur in automated standard-macrocell and gate-array design.

2. Description of the Prior Art

The tremendous complexity of integrated circuits long ago demanded automated tools that could help circuit designers place the functional cells on the floorplan of a chip and to route the interconnecting wires between the cells. Such automated methods are implemented on computers that can too easily fall into traps of localized interconnect congestion and get stuck. Prior art methods tried to ease such localized congestion by expanding each of the cells that were being congested, albeit after the congestion created had already consumed valuable processing time. But this approach was too simple and expanded parts of the cells that were not being congested. So such space ultimately was wasted.

The explosive growth in circuit design sizes and the concomitant intensive use of net list synthesis tools have exceeded fixed-size-constraint macrocell placement routability. Look-ahead methods need to be incorporated into quadratic programs to hierarchically resolve feedthrough congestion. See, "Gordian: VLSI Placement by Quadratic Programming and Slicing Optimization", by Kleinhans et al., IEEE Transactions on Computer-Aided Design, vol. 10, No. 3, March 1991, pp.356–365. Effective local congestion reduction methods can also significantly reduce the overall design's size. Experiments demonstrate that this method requires minimal run time increase and outperforms existing state-of-the-art congestion-driven approaches.

Fixed-size layout systems have recently increased in popularity because the interconnect delays can be accurately estimated, and the wiring patterns can be precisely controlled by maze routers. Smaller design sizes are possible with maze routers because the upper metal layers are more effectively used during routing, especially in designs with three or more signal layers. Quadratic programming methods have been widely used for macrocell placement in fixed-size layout systems, e.g., for their competitive wire length solutions and fast run times. Conventional "Min-Cut" based approaches provide a faster alternative, but yield less optimal results. Prior art "simulated annealing" provides satisfactory placement, but only when given generous run times. And, fixed-size constraints translate to poor usability, tedious weight tuning, and long design turn-around times.

Simultaneous Min-Cut and hierarchical routing has been tried in other prior art systems. The effectiveness of such Min-Cut approaches is limited by their simple-minded one-dimensional projections. Congestion-driven placement methods that are based on multi-partitioning heuristics, partition each chip design floorplan area into uniform two-dimensional arrays of regions.

Heuristic techniques which explore the permutation space of all possible block placements must conduct their trial-and-error searches by using a guiding or goal-oriented mechanism called "cost" or "objective" function. Multiple partitions are made after initially balancing the whole macrocell and wiring areas amongst all the candidate regions. But the performance is limited by how good the initial partition had been and how many regions were used. The published results involve only small designs.

Most heuristic placement algorithms presently operate with a variety of "cost" or "objective" functions, as in simulated annealing and genetic placement methods. Some, such as "Min-Cut", attempt to minimize wire congestion and channel competition by intelligent placement. Others, such as "bounded rectangle", "concentric circle", and "position oriented", seek to improve machine cycle and performance by minimizing total wire or total capacitance. These timing-directed functions are all net oriented, handling all segments of a given net as a single net entity.

Prior art methods that initially use global routing to do a congestion analysis, and then optimize what follows based on the analysis, has also been described in the literature. These methods are intended only for localized improvements based on an exhaustive "greedy" search within small windows. A simulated annealing-based approach, called RISA, does fast and efficient congestion modeling as part of its cost function. But such requires twice the usual run time compared to timing-consuming simulated annealing approaches. See, "Optimization by Simulated Annealing", by S. Kirkpatrick, C. D. Gelatt, and M. P. Vecchi, Science, Vol. 220, No. 4598, pp. 671–680. This highlights the connection that exists between statistical mechanics and combinatorial optimization. It discusses the strong analogy with annealing in solids, thus providing a framework for optimizing the properties of very large and complex systems. This approach does not formulate constructive placement algorithms for initial placement, nor does it address timing optimization of specific critical paths and geometric constraints of path segments. Moreover, it does not provide interactive guidance for defining the assumptions required for initial conditions, such as partitioning boundaries, modeling and optimization of a complete machine.

Conventional quadratic programming approaches have typically been hierarchical and include Min-Cut placement processing to improve wire length. Such quadratic programming methods begin with one region having an initial set of cells to be placed. Arithmetic methods are used to solve various quadratic equations based on weighted clique model of net routing. After moving on in the process to a next level in the hierarchy, Min-Cut is used to split cells with severe overlapping. This produces two sets, each assigned to one of two new regions split from their parent region of the previous level. The objective in splitting the cells is to balance the macrocell density between both sides and to minimize net crossing cut line. The resultant macrocell placement has the same macrocell density across the whole core area, which probably still suffers from local routing congestion.

SUMMARY OF THE INVENTION

It is therefore an object of the present invention to provide an electronic design automation tool for the automatic macrocell placement and routing of metal layers in a standard macrocell array chip design.

It is a further object of the present invention to provide an electronic design automation tool that significantly reduces the design sizes of chips.

It is another object of the present invention to provide a hierarchical look-ahead congestion-driven placement process for use in quadratic programming (QP) type chip design automation programs.

Briefly, an electronic design automation tool embodiment of the present invention comprises a hierarchical quadratic programming layout process with a Min-Cut placement process to improve wire length. A single region with a set of macrocells to be placed is set as an initial condition. Arithmetic processes are used to solve quadratic equations based on the weighted clique model of net routing. At a next iteration level, Min-Cut is used to split the macrocells with severe overlapping into two sub-regions with balanced macrocell densities. The resulting macrocell placements provide uniform densities across the whole core that suffer from localized routing congestion. A hierarchical look-ahead congestion-driven placement process is included in each iteration level that estimates congestion, balances the routing resources and adjusts macrocell densities.

An advantage of the present invention is that an electronic design automation tool is provided and localized routing congestion is reduced.

Another advantage of the present invention is that an electronic design automation tool is provided that reduces localized routing congestion in a single pass implementation that economizes run-times.

These and other objects and advantages of the present invention will no doubt become obvious to those of ordinary skill in the art after having read the following detailed description of the preferred embodiments which are illustrated in the various drawing figures.

IN THE DRAWINGS

DETAILED DESCRIPTION OF THE PREFERRED EMBODIMENT

Figure 1:
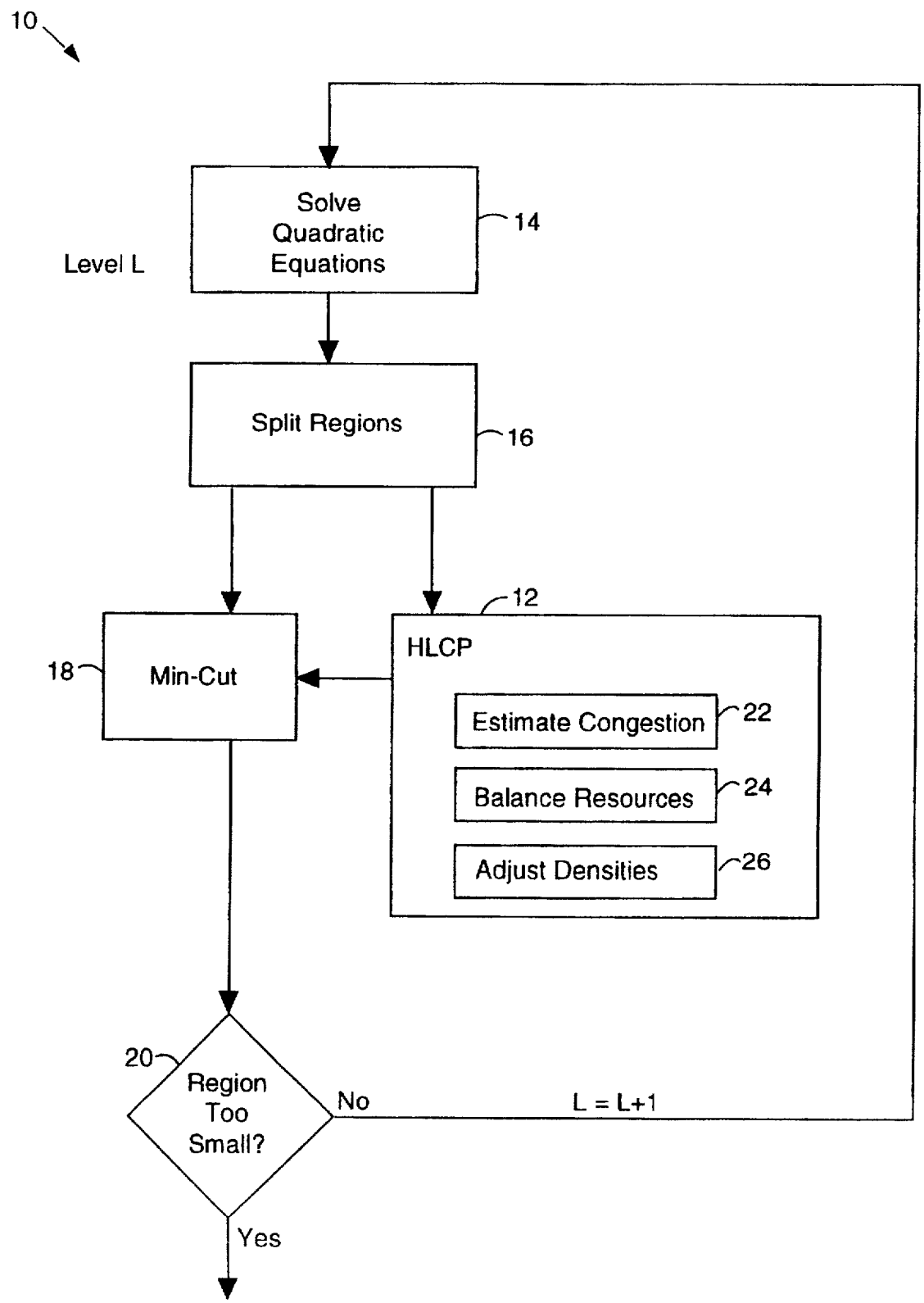
FIG. 1 is a flowchart of a design automation system embodiment of the present invention.

FIG. 1 illustrates a design automation system embodiment of the present invention, referred to by general reference numeral 10. The system 10 is a computer-implemented process that incorporates a hierarchical look-ahead congestion-driven placement (HLCP) process 12 with a conventional quadratic programming architecture to provide a design automation tool. A step 14 solves the corresponding quadratic equations for cells in each region to determine their locations. A step 16 evenly splits the cells and regions into sub-regions. A step 18 does a Min-Cut placement process at each region boundary. A step 20 checks each region to see if it's too small. If not, the iteration level in the hierarchy is incremented and control loops back to the step 14. The HCLP process 12 includes a step 22 for estimating the interconnect congestion that will occur in a next iteration of routing between placed cells in a chip design floorplan area, a step 24 for balancing the routing resources, and a step 26 for adjusting macrocell densities to share the estimated interconnect congestion.

The HCLP process 12 estimates the congestion of one region of the whole floorplan area at a time. A cost is calculated to represent the congestion severity for a set of cells in the region. Such cells are tentatively distributed uniformly within the region. Their corresponding x,y position coordinates are used as a simulated placement at the next iterative level in the hierarchy to predict the consequential routing congestion. The cost estimation preferably includes vertical and horizontal supply, and vertical and horizontal demand, where a weight is attached to each term. For example, the weights are based on the number of available interconnecting metal layers in the current design and any preferred routing direction for each layer.

The routing resources are then balanced amongst several regions, e.g., to adjust the macrocell densities of pairs of adjacent regions in such a way that the estimated routing resource demand versus supply is in balance. A two-step routing resource balancing is preferred. In the first step, a pair of new regions are split from one parent region from a previous level and then each balanced independently. Non-adjacent regions split from different parent regions are not balanced with the other. To improve accuracy in the second step, neighboring regions from the same or different parent regions across the whole core area are balanced. Thus routing resource estimation errors made at the previous levels can be patched at the current level, and thereby prevents error accumulation.

The macrocell densities are optimized between regions. Given two regions, each with a congestion cost calculated from a prior step, the difference between two cost values is transformed into macrocell areas that vary from one region to the other, e.g., to balance the routing resources of both regions. An upper bound is preferably imposed to prevent the overloading of any one region with too much macrocell area. The objective of the initial splitting of region and cells is preferably to maintain even macrocell densities to counter the local congestion. But after each macrocell move, the macrocell density balances are disturbed, and so re-balancing is required.

Look-ahead congestion estimation includes pin bounding box (PBB) partitioning, directional weighting and confidence weighting.

In the quadratic programming approach, there are approximately $2^{(L-1)}$ regions at each iteration level L. Each of these regions has a set of cells to be placed. The solutions typically produced by the quadratic equations provides for substantial overlap between the cells to minimize the wire lengths in the nets. The look-ahead congestion estimation comprises the steps of saving the current locations of all cells, uniformly distributing the cells in each region according to their x,y coordinates, and finding the PBB's for all the nets.

If a PBB overlaps any macrocell, a minimum spanning tree is constructed. For each spanning tree edge, an L-shape is selected that has the least overlap with the macros. Two pseudo PBBs are created to emulate the L-shape routing. Otherwise, the PBB is multiplied with the ratio of Steiner tree length to half of the perimeter length, e.g., the Steiner weight.

Four cost components are calculated, the vertical supply $(S_v)$, the horizontal supply $(S_h)$, the vertical demand $(D_v)$, and the horizontal demand $(D_h)$ for each region. This provides, $S_v=T_v-B_v$, and $S_h=T_h-B_h$, where $T_v$ is the total routing resource in vertical direction, $T_h$ is the total routing resource in horizontal direction, $B_v$ is the total routing blockages of vertically-preferred layer, $B_h$ is the total routing blockages of horizontally-preferred layer, $D_v$ is the estimated vertical routing demand based on the PBBs, and D is the estimated horizontal routing demand based on PBBs.

The congestion cost C of a region can be expressed mathematically by, $$C = W_h \times (F_d \times D_h + S_h) + W_v \times (F_d \times D_v + S_v)$$

where, $W_h$ is the weighting on horizontal routing resource, $W_v$ is the weighting on the vertical routing resource $W_h+W_v=1$, and $F_d$ is the confidence factor of the demand estimation.

PBB partitioning occurs when a bounding box of pins of a net overlaps at least one large macrocell block, a routing detour can occur that must be modeled accurately. An approach different from that used by conventional RISA methods is preferred.

Figure 2:
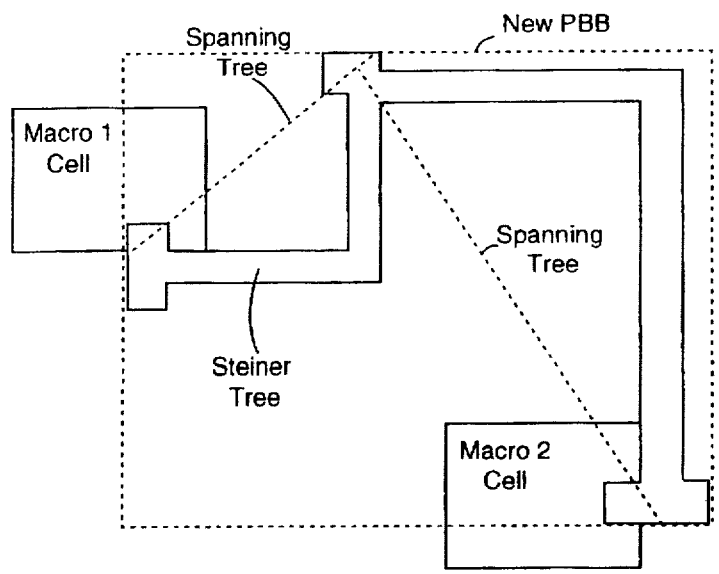
FIG. 2 is a diagram of pin bounding box partitioning where there is an overlap with macrocells.

FIG. 2 shows how a typical such net of three pins can be broken into a set of PBBs with Steiner weight of one. The selection of a left-L or a right-L simulates route detouring. Each L is expanded by a particular amount to simulate a local detouring effect. Since a minimum spanning tree is built before the selection of L, each branch can be considered as a two-pin net.

Directional horizontal and vertical weighting ($W_h$, $W_v$) is used because cells that have been spaced apart will increase the routing porosity through cells. For horizontally aligned macrocell rows, vertical routing is made easier. However, macrocell spacing optimization only indirectly helps to relieve horizontal routing congestion, because detouring increases. Congestion reduction therefore depends on accurate congestion modeling and coordinating the various weights used by the directional routing resource. For example, in a three-layer metal design that does not use channels, the preferred weighting for horizontal macrocell rows runs is $W_h=0.4$ and $W_v=0.6$.

The confidence weighting depends on the severity of the initial macrocell overlap condition. During the initial stages in a typical quadratic programming process, the cells will substantially overlap one another. The look-ahead routing demand estimation process preferably balances the cells evenly to simulate a final macrocell placement. Such final macrocell placement simulation will be farther from the ultimate reality when the initial condition macrocell overlap is more severe. How wide the spread of the macrocell distribution is within a given region under calculation can be represented by a function ($F_d$), with a range of 0.0–1.0. When the macrocell density distributions of two separate regions are to be optimized, the smaller ($F_d$) of the two regions is used for both regions to make any comparison fairer.

The hierarchical routing resource balancing is preferably such that at each level L in a quadratic programming approach, there are $2^L$ regions, where L is initially zero. Each region is divided into two sub-regions that each become regions at the next level, L+1. Therefore, there will be $2^{L+1}$ regions after the division.

Figure 3:
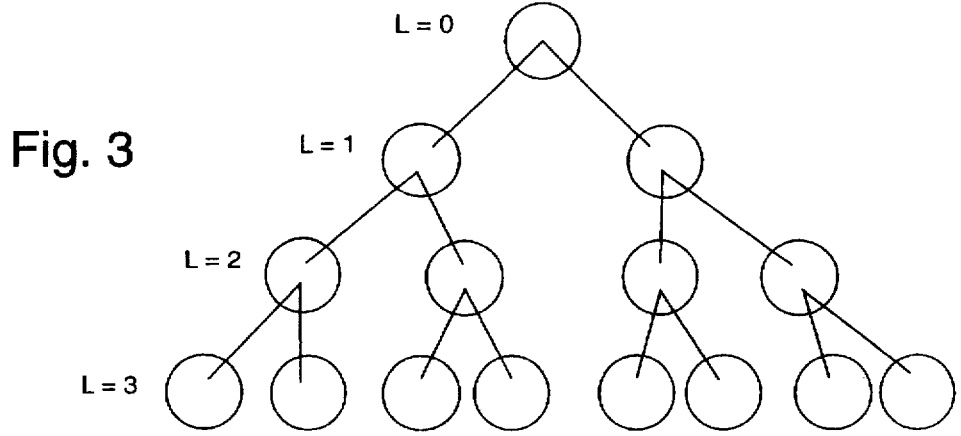
FIG. 3 is a diagram of a hierarchical region tree progressing from L=2 to L=3.

FIG. 3 shows a region tree that has progressed from level L=2 to L=3. The regions of level L=2 are each split into two sub-regions that become the regions of level L=4. The routing resources are then balanced between each selected pair of sub-regions by adjusting the x,y positions of individual cells. Every sub-region is balanced with each of its four neighboring sub-regions (north, south, east, west).

Figure 4:
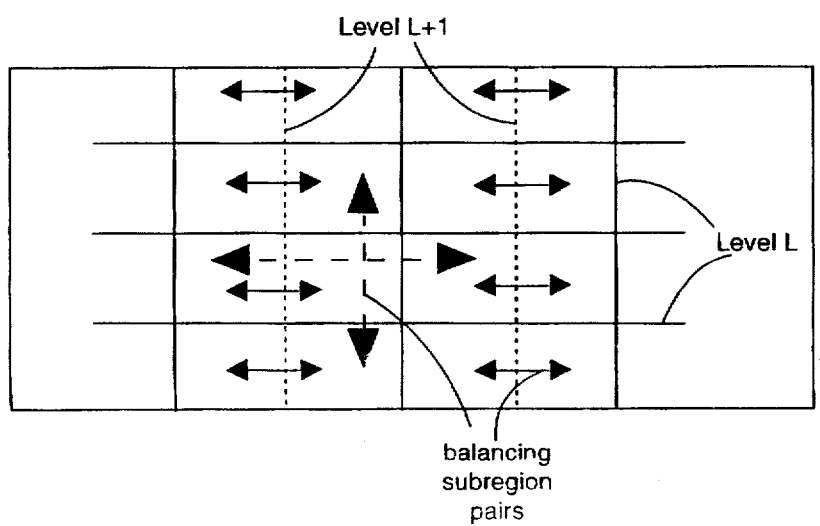
FIG. 4 is a diagram that represents the balancing of region pairs.

FIG. 4 represents the balancing of sub-region pairs. The optimization of macrocell densities comprises defining the area of a sub-region (A), the total macrocell area of the sub-region ($A_c$), the macrocell area to be removed from the sub-region ($A_m$), the actual congestion cost of a sub-region ($C_a$) the target congestion cost of the sub-region ($C_t$), and the congestion per macrocell area ($R_c$).

The target congestion cost of a first sub-region ($C_{t1}$) is therefore the sum of the actual congestion costs of the first and a second subregion ($C_{a1}$ and $C_{a2}$) multiplied by the area of the first sub-region ($A_1$), and all divided by the sum of the areas of the first and second sub-regions ($A_1$ and $A_2$). This can be expressed mathematically as, $C_{t1}=(C_{a1}+C_{a2}) A_1/(A_1+A_2)$.

The target congestion cost of the second sub-region ($C_{t2}$) is the sum of the actual congestion costs of the first and second sub-regions ($C_{a1}$ and $C_{a2}$) multiplied by the area of the second sub-region ($A_2$), and all divided by the sum of the areas of the first and second sub-regions ($A_1$ and $A_2$). This can be expressed mathematically as, $C_{t2}=(C_{a1}+C_{a2}) A_2/(A_1+A_2)$.

The congestion per macrocell area of the first region ($R_{c1}$) is the ratio of the actual congestion cost of the first sub-region ($C_{a1}$) to the total macrocell area of the first sub-region ($A_{c1}$). This can be expressed mathematically as, $R_{c1}=C_{a1}/A_{c1}$.

The congestion per macrocell area of the second region ($R_{c2}$) is the ratio of the actual congestion cost of the second sub-region ($C_{a2}$) to the total macrocell area of the second sub-region ($A_{c2}$). This can be expressed mathematically as, $R_{c2}=C_{a2}/A_{c2}$.

The macrocell area to be removed from the first sub-region ($A_{m1}$) is the absolute difference between the target congestion cost of the first sub-region ($C_{t1}$) and the actual congestion cost of the first sub-region ($C_{a1}$), divided by the congestion per macrocell area of the first sub-region ($R_{c1}$). This can be expressed mathematically as, $A_{m1}=|C_{t1}-C_{a1}|/R_{c1}$.

The macrocell area to be removed from the second sub-region ($A_{m2}$) is the absolute difference between the target congestion cost of the second sub-region ($C_{t2}$) and the actual congestion cost of the second sub-region ($C_{a2}$), divided by the congestion per macrocell area of the second sub-region ($R_{c2}$). This can be expressed mathematically as, $A_{m2}=|C_{t2}-C_{a2}|/R_{c2}$.

The final amount of macrocell area ($A_m$) to be moved from the sub-region with a positive ($C_t-C_a$) to the other sub-region with a negative ($C_t-C_a$) is the average of the two macrocell areas to be moved (Am1 and Am2). This can be expressed mathematically as, $A_m=(A_{m1}+A_{m2})/2$.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A method of automatic semiconductor chip design, the method comprising the steps of:

estimating the interconnect congestion that will occur in a next iteration of routing between placed cells in a chip design floorplan area to look-ahead;

balancing routing resources; and adjusting macrocell densities to share the estimated interconnect congestion;

wherein, the estimating of the interconnect congestion progresses one region of a whole floorplan area at a time, and a cost estimation is calculated to represent a congestion severity for a set of cells in each region, and each of said set of cells are tentatively distributed uniformly within the region; and wherein, corresponding x,y position coordinates of each said cell are used as a simulated placement at the next iterative level in a hierarchy to predict a consequential routing congestion.

2. The method of claim 1, wherein:
the balancing includes hierarchically adjusting the macrocell density amongst regions; and
said cost estimation includes a vertical and horizontal supply, and a vertical and horizontal demand, where a weight is attached to each term that is based on the number of available interconnecting layers in a current design and any preferred routing direction for each layer.

3. An electronic design automation tool comprising:
a hierarchical quadratic programming layout process with a Min-Cut placement process to improve wire length, wherein a single region with a set of macrocells to be placed is set as an initial condition and arithmetic processes are used to solve quadratic equations based on the weighted clique model of net routing, and wherein at a next iteration level, said Min-Cut is used to split the macrocells with severe overlapping into two sub-regions with balanced macrocell densities such that the resulting macrocell placements provide uniform densities across the whole core that suffer from localized routing congestion; and
a hierarchical look-ahead congestion-driven placement process included in each iteration level of said splitting of said regions into sub-regions that estimates congestion in the next iteration level, balances the routing resources and adjusts macrocell densities.

4. The tool of claim 3, further comprising:
means for defining the area of a sub-region (A), the total macrocell area of the sub-region ($A_c$), the macrocell area to be removed from the sub-region ($A_m$), the actual congestion cost of a sub-region ($C_a$), the target congestion cost of the sub-region ($C_t$), a difference between the actual and the target congestion cost of a sub-region ($C_t-C_a$) which can be positive or negative, and the congestion per macrocell area ($R_c$).

5. The tool of claim 4, wherein:
said target congestion cost of a first sub-region ($C_{t1}$) is the sum of the actual congestion costs of the first and a second sub-region ($C_{a1}$ and $C_{a2}$) multiplied by the area of the first sub-region ($A_1$), all divided by the sum of the areas of the first and second sub-regions ($A_1$ and $A_2$) that can be expressed mathematically as, $C_{t1}=(C_{a1}+C_{a2}) A_1/(A_1+A_2)$.

6. The tool of claim 4, wherein:
said target congestion cost of the second sub-region ($C_{t2}$) is the sum of the actual congestion costs of the first and second sub-regions ($C_{a1}$ and $C_{a2}$) multiplied by the area of the second sub-region ($A_2$), and all divided by the sum of the areas of the first and second sub-regions ($A_1$ and $A_2$) that can be expressed mathematically as, $C_{t2}=(C_{a1}+Ca_2) A_2/(A_1+A_2)$.

7. The tool of claim 4, wherein:
said congestion per macrocell area of the first region ($R_{c1}$) is the ratio of the actual congestion cost of the first sub-region ($C_{a1}$) to the total macrocell area of the first sub-region ($A_{c1}$) that can be expressed mathematically as, $R_{c1}=C_{a1}/A_{c1}$.

8. The tool of claim 4, wherein:
said congestion per macrocell area of the second region ($R_{c2}$) is the ratio of the actual congestion cost of the second sub-region ($C_{a2}$) to the total macrocell area of the second sub-region ($A_{c2}$) that can be expressed mathematically as, $R_{c2}=C_{a2}/A_{c2}$.

9. The tool of claim 4, wherein:
said macrocell area to be removed from the first sub-region ($A_{m1}$) is the absolute difference between the target congestion cost of the first sub-region ($C_{t1}$) and the actual congestion cost of the first sub-region ($C_{a1}$), divided by the congestion per macrocell area of the first sub-region ($R_{c1}$) that can be expressed mathematically as, $A_{m1}=|C_{t1}-C_{a1}|/R_{c1}$.

10. The tool of claim 4, wherein:
said macrocell area to be removed from the second sub-region ($A_{m2}$) is the absolute difference between the target congestion cost of the second sub-region ($C_{t2}$) and the actual congestion cost of the second sub-region ($C_{a2}$), divided by the congestion per macrocell area of the second sub-region ($R_{c2}$) that can be expressed mathematically as, $A_{m2}=|C_{t2}-C_{a2}|/R_{c2}$.

11. The tool of claim 4, wherein:
the final amount of macrocell area ($A_m$) to be moved from the sub-region with a positive ($C_t-C_a$) to the other sub-region with a negative ($C_t-C_a$) is the average of the two macrocell areas to be moved (Am1 and Am2) and can be expressed mathematically as, $A_m=(A_{m1}+A_{m2})/2$.

12. An electronic design automation tool comprising:
a hierarchical quadratic programming layout process with a Min-Cut placement process to improve wire length, wherein a single region with a set of macrocells to be placed is set as an initial condition and arithmetic processes are used to solve quadratic equations based on the weighted clique model of net routing, and wherein at a next iteration level, said Min-Cut is used to split the macrocells with severe overlapping into two sub-regions with balanced macrocell densities such that the resulting macrocell placements provide uniform densities across the whole core that suffer from localized routing congestion;
a hierarchical look-ahead congestion-driven placement process included in each iteration level of said splitting of said regions into sub-regions that estimates congestion, in the next iteration level balances the routing resources and adjusts macrocell densities; and
means for defining the area of a sub-region (A), the total macrocell area of the sub-region ($A_c$), the macrocell area to be removed from the sub-region ($A_m$), the actual congestion cost of a sub-region ($C_a$), the target congestion cost of the sub-region ($C_t$), a difference between the actual and the target congestion cost of a sub-region ($C_t-C_a$) which can be positive or negative, and the congestion per macrocell area ($R_c$);
wherein, said target congestion cost of a first sub-region ($C_{t1}$) is the sum of the actual congestion costs of the first and a second sub-region ($C_{a1}$ and $C_{a2}$) multiplied by the area of the first sub-region ($A_1$), all divided by the sum of the areas of the first and second sub-regions ($A_1$ and $A_2$) that can be expressed mathematically as, $C_{t1}=(C_{a1}+C_{a2}) A_1/(A_1+A_2)$;
wherein, said target congestion cost of the second sub-region ($C_{t2}$) is the sum of the actual congestion costs of the first and second sub-regions ($C_{a1}$ and $C_{a2}$) multiplied by the area of the second sub-region ($A_2$), and all divided by the sum of the areas of the first and second sub-regions ($A_1$ and $A_2$) that can be expressed mathematically as, $C_{t2}=(C_{a1}+C_{a2}) A_2/(A_1+A_2)$;
wherein, said congestion per macrocell area of the first region ($R_{c1}$) is the ratio of the actual congestion cost of the first sub-region ($C_{a1}$) to the total macrocell area of the first sub-region ($A_{c1}$) that can be expressed mathematically as, $R_{c1}=C_{a1}/A_{c1}$;

wherein, said congestion per macrocell area of the second region ($R_{c2}$) is the ratio of the actual congestion cost of the second sub-region ($C_{a2}$) to the total macrocell area of the second sub-region ($A_{c2}$) that can be expressed mathematically as, $R_{c2}=C_{a2}/A_{c2}$;

wherein, said macrocell area to be removed from the first sub-region ($A_{m1}$) is the absolute difference between the target congestion cost of the first sub-region ($C_{t1}$) and the actual congestion cost of the first sub-region ($C_{a1}$), divided by the congestion per macrocell area of the first sub-region ($R_{c1}$) that can be expressed mathematically as, $A_{m1}=|C_{t1}-C_{a1}|/R_{c1}$;

wherein, said macrocell area to be removed from the second sub-region ($A_{m2}$) is the absolute difference between the target congestion cost of the second sub-region ($C_{t2}$) and the actual congestion cost of the second sub-region ($C_{a2}$), divided by the congestion per macrocell area of the second sub-region ($R_{c2}$) that can be expressed mathematically as, $A_{m2}=|C_{t2}-C_{a2}|/R_{c2}$; and wherein, the final amount of macrocell area ($A_m$) to be moved from the sub-region with a positive ($C_t-C_a$) to the other sub-region with a negative ($C_t-C_a$) is the average of the two macrocell areas to be moved ($A_{m1}$ and $A_{m2}$) and can be expressed mathematically as, $A_m=(A_{m1}+A_{m2})/2$.

* * * * *